(12) United States Patent
Huang et al.

(10) Patent No.: US 8,351,286 B2
(45) Date of Patent: Jan. 8, 2013

(54) TEST METHOD FOR SCREENING MANUFACTURING DEFECTS IN A MEMORY ARRAY

(75) Inventors: Yin Chin Huang, Jhubei (TW); Chu Pang Huang, Hsinchu (TW)

(73) Assignee: Macronix International Co., Ltd., Hsin-Chu (TW)

( * ) Notice: Subject to any disclaimer, the term of this patent is extended or adjusted under 35 U.S.C. 154(b) by 302 days.

(21) Appl. No.: 12/842,605

(22) Filed: Jul. 23, 2010

(65) Prior Publication Data

US 2012/0020164 A1 Jan. 26, 2012

(51) Int. Cl.
*G11C 7/00* (2006.01)
(52) U.S. Cl. .............. 365/200; 365/201; 365/185.09; 365/185.33; 714/710; 714/715; 714/718; 714/721; 714/766
(58) Field of Classification Search .......... 365/200, 365/201, 185.09, 185.33; 714/710, 715, 714/718, 721, 766
See application file for complete search history.

(56) References Cited

U.S. PATENT DOCUMENTS

| 2004/0015756 A1* | 1/2004 | Chiu et al. ............ 714/719 |
| 2006/0198221 A1* | 9/2006 | Rudeck et al. ........ 365/206 |

\* cited by examiner

*Primary Examiner* — Vu Le
*Assistant Examiner* — Han Yang
(74) *Attorney, Agent, or Firm* — Alston & Bird LLP (57) ABSTRACT

A method of screening manufacturing defects at a memory array may include programming a background pattern of physically inverse data along conductive lines extending in a first direction. The programming may include providing a program conductive line with a high value. The method may further include programming a memory cell at an intersection of the program conductive line and a conductive line extending in a second direction to a selected high value, and determining whether a cell initially at a low value and associated with a conductive line extending in the first direction and adjacent to the program conductive line is disturbed.

15 Claims, 8 Drawing Sheets

Adjacent BLs are under HV stress.

TEST METHOD FOR SCREENING MANUFACTURING DEFECTS IN A MEMORY ARRAY

TECHNOLOGICAL FIELD

Embodiments of the present invention relate generally to semiconductor device manufacturing and, more particularly, relate to a process for screening manufacturing defects in semiconductor devices such as memory arrays.

BACKGROUND

Since the advent of computers, there has been a steady drive toward producing smaller and more capable electronic devices, such as computing devices, communication devices and memory devices. In order to reduce the size of such devices, while maintaining or improving their respective capabilities, the size of components within the devices must be reduced. Several of the components within electronic devices are made from semiconductor materials, which in some cases are provided via a structure called a semiconductor wafer. Semiconductor wafers may be used to produce integrated circuits (ICs) having the performance and size characteristics desirable for a particular component.

Since modern integrated circuits can be manufactured to such small scales, any defects on the ICs may have a relatively large impact on performance. If a defect is of a nature or size that is sufficient to damage semiconductor circuits or degrade the operating characteristics of such circuits, the corresponding semiconductor device's performance may be deteriorated. Defects, which may be produced during any of a plurality of manufacturing process steps, may cause shorts, opens or other anomalies that prevent normal operation of the semiconductor device. The impact caused by a particular defect is often directly related to the corresponding nature (e.g., size and/or location) of the defect. These defects must typically be recognized so that the defective components may be removed before they are provided to consumers.

Numerous testing processes have been developed to attempt to identify defects at various stages of the production process. However, a common problem with conventional testing procedures is the fact that several cycles of testing may be required in order to detect potential defects in various aspects of device performance, thereby increasing the cost of testing and consuming testing capacity resources.

Accordingly, it may be desirable to provide an improved testing method that may address some of the shortcomings described above.

BRIEF SUMMARY OF EXEMPLARY EMBODIMENTS

Embodiments of the present invention are therefore provided that may enable the provision of a test method for screening manufacturing defects in semiconductor devices such as memory arrays. In some example embodiments, metal line defects may be screened so that infant failure rates of components may be substantially reduced or even eliminated. Accordingly, for example, potential metal line defects may be detected to bin-out the corresponding devices before shipment to reduce cost with less test capacity instead of using several test cycles.

In an example embodiment, a method of screening manufacturing defects at a memory array is provided. The method may include programming a background pattern of physically inverse data along conductive lines extending in a first direction. The programming may include providing a program conductive line with a high value. The method may further include programming a memory cell at an intersection of the program conductive line and a conductive line extending in a second direction to a selected high value, and determining whether a cell initially at a low value and associated with a conductive line extending in the first direction and adjacent to the program conductive line is disturbed.

It is to be understood that the foregoing general description and the following detailed description are exemplary, and are not intended to limit the scope of the invention.

BRIEF DESCRIPTION OF THE SEVERAL VIEWS OF THE DRAWING(S)

Having thus described the invention in general terms, reference will now be made to the accompanying drawings, which are not necessarily drawn to scale, and wherein:

FIG. 2, which includes

FIG. 5, which includes

DETAILED DESCRIPTION

Some embodiments of the present invention will now be described more fully hereinafter with reference to the accompanying drawings, in which some, but not all embodiments of the invention are shown. Indeed, various embodiments of the invention may be embodied in many different forms and should not be construed as limited to the embodiments set forth herein; rather, these embodiments are provided so that this disclosure will satisfy applicable legal requirements.

Figure 1:
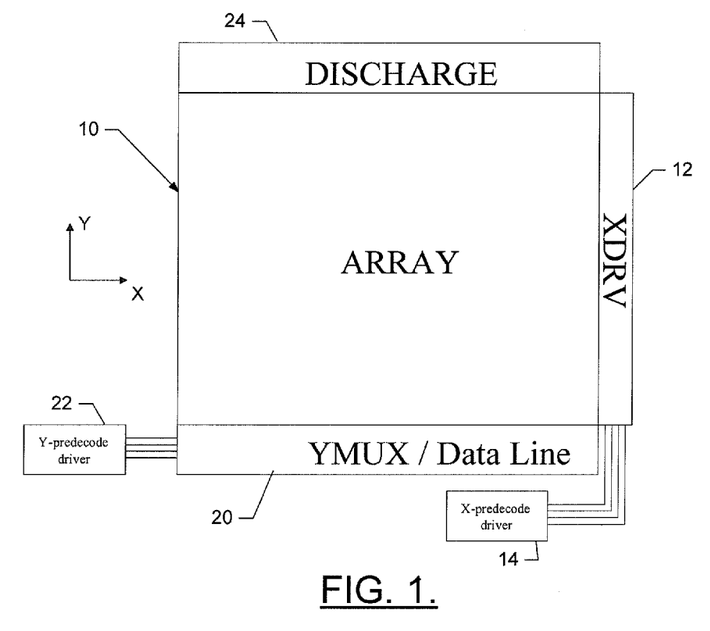
FIG. 1 illustrates a generic arrangement of a memory array according to an example embodiment of the present invention.

Some embodiments of the present invention may enable the determination of metal line defects in semiconductor devices such as memory arrays. FIG. 1 illustrates a generic arrangement of an example memory array 10. The memory array 10 may include a NOR flash memory or a NAND flash memory in some examples and may include a plurality of memory cells arranged in columns and rows. The rows of cells, which may extend in the X-direction, may be connected to a plurality of parallel conductive lines spaced apart from one another to form word lines. The columns of cells, which may extend in the Y-direction, may also be connected to a plurality of parallel conductive lines spaced apart from each other to form bit lines. The word lines and bit lines may be used in connection with one another in order to read data from and write data to particular cells and to erase cells when desired.

In an example embodiment, the memory array 10 may further include an XDRV (X data row view) 12 through which a X-precode driver 14 may access word lines of the memory array 10. The memory array 10 may also include a YMUX/Data line region 20 through which a Y-precode driver 22 may access bit lines of the memory array 10. A discharge region 24 may also be provided. As discussed above, the memory array 10 may be susceptible to the potential for process defects in one or more of the YMUX/Data line region 20, in the XDRV 12, the bit lines or the data lines. As such, for example, capacitive or resistive defects in metal lines in any of the regions described above may cause the device to become non-conforming with respect to product specification or data sheet requirements.

Figure 2A:
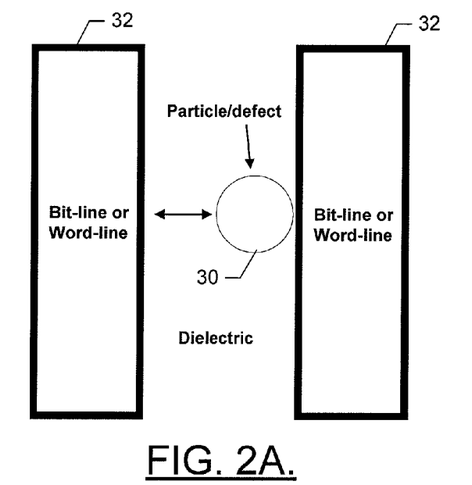
FIGS. 2A and 2B, illustrates an example of a particle or defect that may be formed between two bit lines or word lines to provide a capacitive or resistive defect according to an example embodiment of the present invention.
Figure 2B:
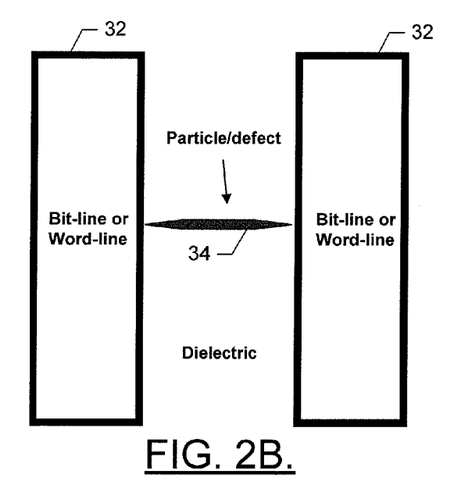

FIG. 2A illustrates an example of a particle or defect 30 that may be formed between two bit lines or word lines 32 to provide a capacitive defect. In this regard, the particle or defect 30 may be in a dielectric material between the two bit lines or word lines 32 to modify the capacitive coupling between the two bit lines or word lines 32. FIG. 2B illustrates a resistive defect scenario in which a particle or defect 34 is formed in the dielectric between the two bit lines or word lines 32 in such a manner as to connect the two bit lines or word lines 32 (e.g., to form a short or partial short therebetween). The resistive defect and/or the capacitive defect need not necessarily physically connect the two bit lines or word lines 32 in order to degrade performance. For example, when one of the two bit lines or word lines 32 is exposed to a high voltage, a particle or defect (30 or 34) may cause the other of the two bit lines or word lines 32 to be disturbed (e.g., have its voltage level altered) due to resistive or capacitive coupling caused by the particle or defect (30 or 34). In some cases, one or more resistive or capacitive defects may exist between any of the word lines or bit lines of a memory array. Moreover, in some cases, hybrid defects including both resistive and capacitive defects may exist. Some embodiments of the present invention may provide a mechanism by which improvements may be experienced in relation to recognition of the existence of the above-mentioned defects.

Figure 3:
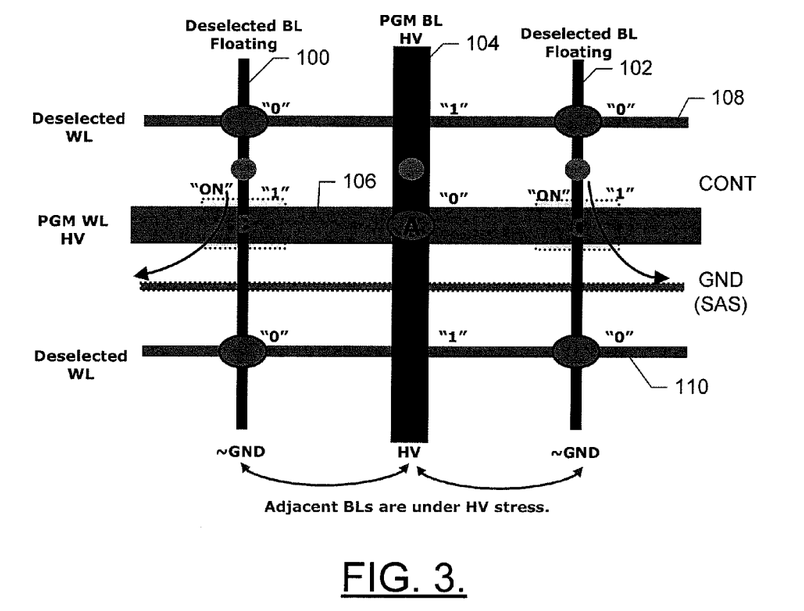
FIG. 3 illustrates an example architecture of a portion of a memory array that may be exposed to a particular stress sequence to enable detection of a capacitive defect according to an example embodiment of the present invention.

FIG. 3 illustrates an example architecture of a portion of a memory array (e.g., the memory array 10) that may be exposed to a particular stress sequence to enable detection of a capacitive defect according to an example embodiment. As shown in FIG. 3, a background pattern of physically inverse data may be programmed along the bit line (BL) direction. As such, a first deselected bit line 100 and a second deselected bit line 102 may be floating at approximately ground (GND). The first deselected bit line 100 and the second deselected bit line 102 may be on opposite sides of a program bit line (PGM BL) 104 that may be programmed with a relatively high voltage (HV). Next, an I-IVt cell A may be re-programmed using a selectable word line (WL) voltage having a level between HVt (a relatively high voltage value such as, for example, 8V) and LVt (a relatively low voltage value such as, for example, 4V) cells. As such, a program word line (PGM WL) 106 may have HV (e.g., 6V) applied thereto while a first deselected WL 108 and a second deselected WL 110, positioned on opposite sides of the PGM WL 106, may remain deselected.

Accordingly, based on the application of the HV to HVt cell A via programming provided over the selectable PGM WL 106, the PGM BL 104 may sustain a high voltage with less voltage drop due to a very slight current flow and the first and second deselected BL 100 and 102 would be expected to reach ground level due to discharging through LVt cell B and LVt cell C, respectively. By applying the high voltage to the PGM BL 104, any adjacent BL may be under a high voltage stress. If there is some capacitive defect between the PGM BL 104 and either of the first and second deselected BL 100 and 102, the defect would be likely to breakdown and short while the high voltage stress is applied. If the capacitive defect causes breakdown, any LVt cell (e.g., LVt cell B or LVt cell C) affected by the capacitive defect would be disturbed when the adjacent HVt cell is programmed along the same WL direction (e.g., being disturbed from LVt toward HVt). Accordingly, capacitive defects may be detected between adjacent metal lines by applying a stress, in response to which a disturbance of an adjacent cell may be experienced in the presence of a defect. Based on whether the disturbance is experienced in an adjacent cell, it may be determined as to whether a capacitive defect exists between the PGM BL 104 and an adjacent BL. Thus, capacitive defects may be detected by applying a stress test as indicated above.

Figure 4:
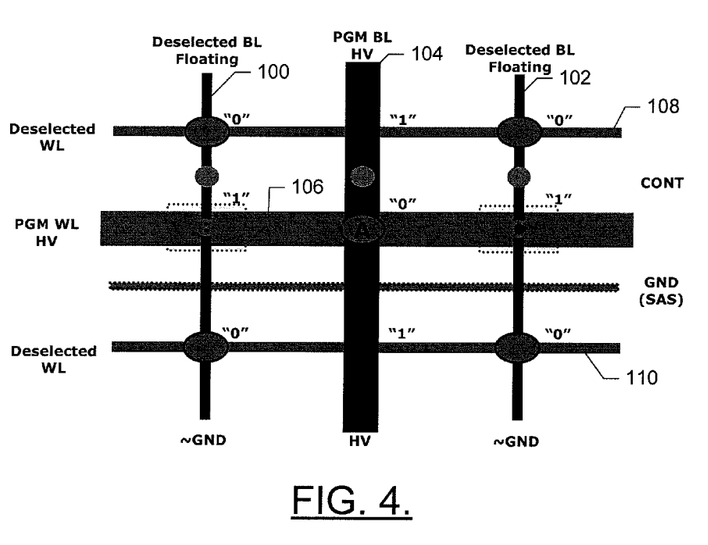
FIG. 4 illustrates an example architecture of a portion of a memory array that may be exposed to a disturbance sequence to enable detection of a resistive defect according to an example embodiment of the present invention.

FIG. 4 illustrates an example architecture of a portion of a memory array (e.g., the memory array 10) that may be exposed to a disturbance sequence to enable detection of a resistive defect according to an example embodiment. As shown in FIG. 4, a background pattern of physically inverse data may be programmed along the bit line (BL) direction as described above. Thus, the first deselected bit line 100 and a second deselected bit line 102 may be floating at approximately ground (GND). The first deselected bit line 100 and the second deselected bit line 102 may be on opposite sides of the PGM BL 104 that may be programmed with the relatively high voltage (HV). Next, an HVt cell A may be re-programmed using a selectable word line (WL) voltage having a level high enough to produce a hot electron program current. As such, the PGM WL 106 may have HV (e.g., PGM WL=10V) applied thereto while the first deselected WL 108 and the second deselected WL 110, positioned on opposite sides of the PGM WL 106, may remain deselected.

Accordingly, by applying the high voltage to the PGM BL 104, any adjacent BL in which there is some resistive defect may be expected to experience an induced voltage from the resistive defect. Thus, for example, if there is some resistive defect between the PGM BL 104 and either of the first and second deselected BL 100 and 102, the defect would be likely to cause hot electron programming of nearby cells while the high voltage is applied. If the resistive defect causes a current sufficient to create hot electron programming, any LVt cell (e.g., LVt cell B or LVt cell C) affected by the resistive defect would be disturbed when the adjacent HVt cell is programmed along the same WL direction (e.g., being disturbed from LVt toward HVt). Accordingly, resistive defects may be detected between adjacent metal lines by applying a disturbance method as described above.

Figure 5A:
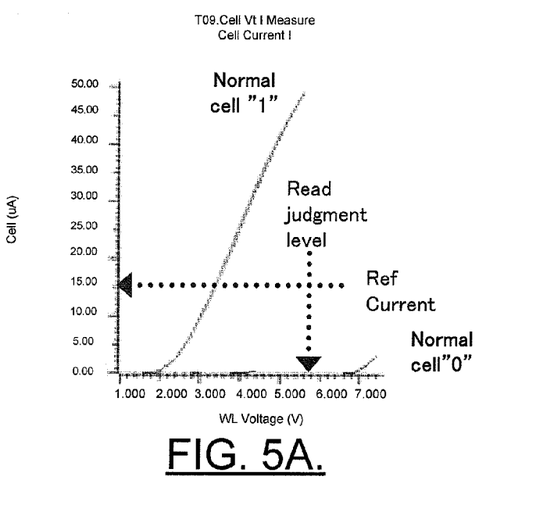
FIGS. 5A to 5D, illustrates a schematic illustration of screening methods according to example embodiments of the present invention.
Figure 5B:
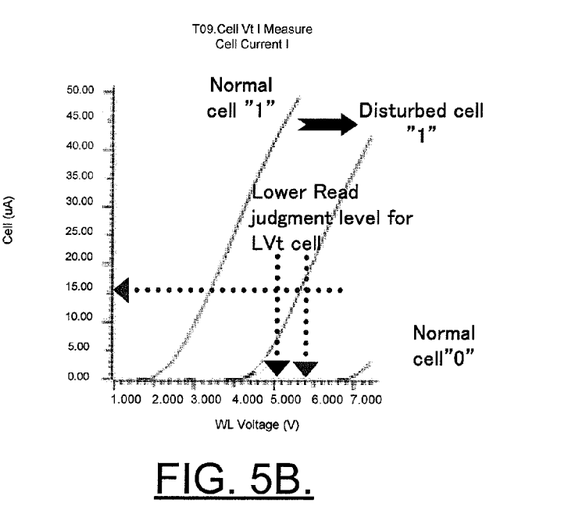
Figure 5C:
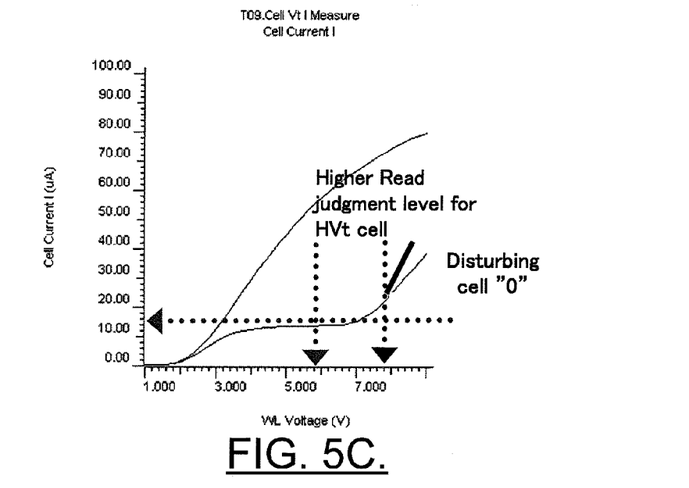
Figure 5D:
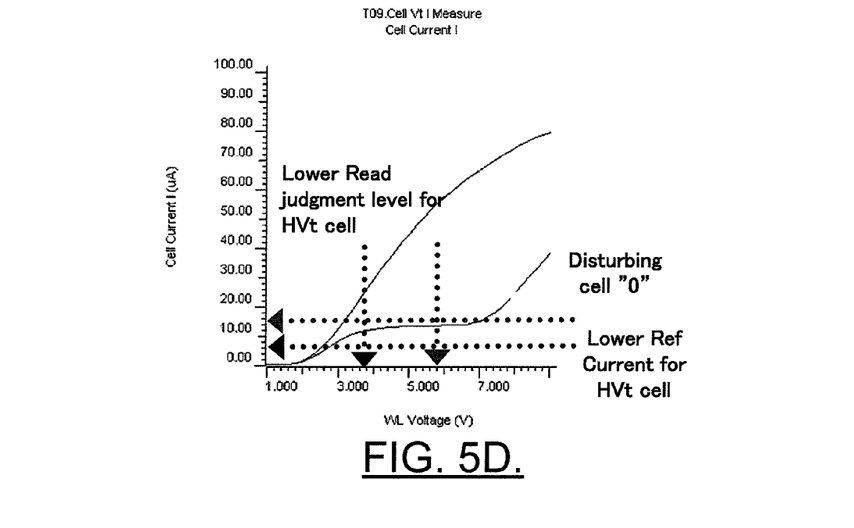

In addition or as an alternative to the stress and disturbance methods described above, some embodiments may employ a screening operation to attempt to detect certain defects as indicated in FIG. 5, which includes FIGS. 5A to 5D. FIG. 5A illustrates a schematic illustration of a normal read method having a judgment level set between HVt and LVt cells. In this regard, the normal read judgment level for distinguishing between a normal cell having a high or one value (e.g., normal cell "1") and a normal cell having a low or zero value (e.g., normal cell "0") is shown. However, when a cell is disturbed (e.g., in response to the stress or disturbance methods described above in reference to FIGS. 3 and 4), the disturbed cell may have a value (e.g., disturbed cell "1") that lies between the normal cell "1" and the normal cell "0." In some cases, the value of the disturbed cell "1" may lie very near the normal read judgment level making it difficult to accurately determine whether a disturbance has occurred. Thus, it may be desirable to lower the read judgment level for reading low value cells in order to more accurately distinguish a disturbed cell. FIG. 5B shows a screening method for LVt cells to lower down the array WL level after stress or disturbance is applied. Accordingly, a disturbed cell may be more accurately distinguished. When a HVt cell is a disturbing cell, a higher read judgment level for the HVt cell may be desirable to reduce the possibility of an incorrect reading of the cell after the stress or disturbance methods described above have been applied. FIG. 5C is an illustration of a screening method for HVt cells to increase the array WL level after stress or disturbance is applied. In some cases, both the read judgment level for the HVt cell and the reference current for the HVt cell may be lowered to decrease the likelihood of any inaccurate readings. FIG. 5D illustrates a screening method for resistive defects to lower a reference current and the array WL level only for an HVt cell.

Although the examples described above related to detection of capacitive and resistive defects in bit lines of a memory array, it should be noted that example embodiments could be practiced in connection with detecting defects between any parallel metal lines in a similar fashion. Thus, for example, embodiments may also be practiced in connection with fault detection in word line directions, for YMUX, data lines and/or XDRV. Generically speaking, example embodiments involve three potential sub-operations including application of the stress method described in reference to FIG. 3, application of the disturbance method described in reference to FIG. 4, and a screening method as described in connection with FIG. 5. For various manufacturing defects such as capacitive defects, resistive defects and hybrid defects, selected ones or combinations of the sub-operations may be utilized to create suitable production flow to bin-out potential failure chips prior to shipment of the chips to consumers. As such, no change in array patterns may be needed in order to detect potential manufacturing defects and conventional pre-cycling tests may be avoided.

Figure 6:
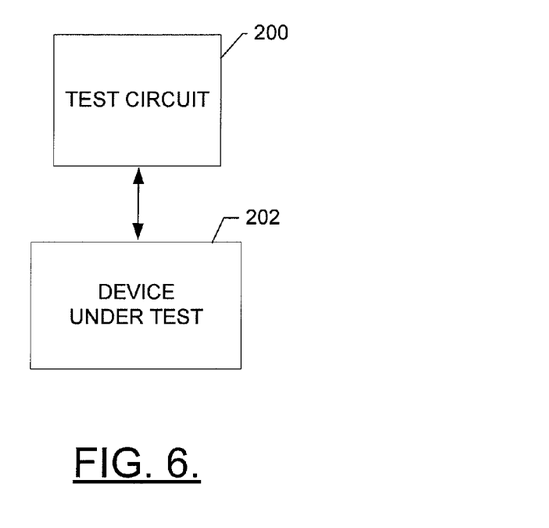
FIG. 6 illustrates an example of a test circuit being used in connection with a device under test according to an example embodiment of the present invention.

Although testing such as that described above could be manually conducted in some cases, in an example embodiment, the test method described above may be employed using a testing circuit configured to apply voltages to selected lines to be tested. FIG. 6 illustrates an example of a test circuit 200 being used in connection with a device under test (DUT) 202. The DUT 202 may be a memory array like the memory array 10 of FIG. 1 or any other suitable memory array structure including NOR or NAND flash memories. The test circuit 200 may include sensors for detecting voltage and/or current levels in cells at which disturbance is being measured when a stress, disturbance or screening operation described above is employed. The test circuit 200 may also include signal generation capability to selectably provide voltages for testing (e.g., the HV for providing a high voltage stress) selected metal lines.

Figure 7:
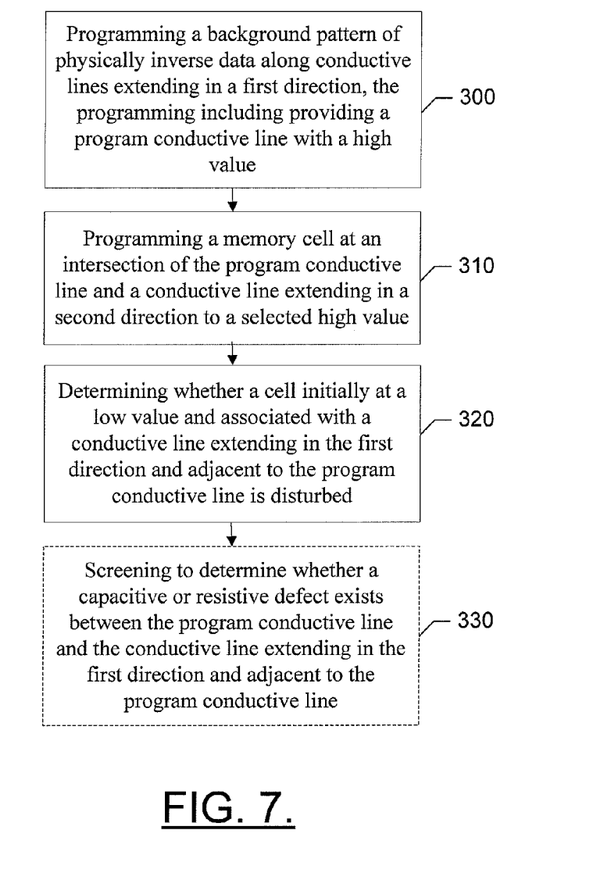
FIG. 7 is a block diagram describing a method for screening manufacturing defects at a memory array according to an example embodiment of the present invention.

FIG. 7 is a flowchart illustrating operations associated with an example method of screening manufacturing defects at a memory array according to an example embodiment. It should be understood that each block of the flowchart, and combinations of blocks in the flowchart, can be implemented by various mechanisms, such as under the control of an operator or via hardware, firmware, and/or software including one or more computer program instructions. For example, one or more of the procedures described herein may be embodied by computer program instructions. In this regard, the computer program instructions which embody the procedures described above may be stored by a memory and executed by a processor. As will be appreciated, any such computer program instructions may be loaded onto a computer or other programmable apparatus (i.e., hardware) to produce a machine, such that the instructions which execute on the computer or other programmable apparatus create means for implementing the functions specified in the flowchart block(s). These computer program instructions may also be stored in a computer-readable electronic storage memory that can direct a computer or other programmable apparatus to function in a particular manner, such that the instructions stored in the computer-readable memory produce an article of manufacture including instruction means which implement the function specified in the flowchart block(s). The computer program instructions may also be loaded onto a computer or other programmable apparatus to cause a series of operations to be performed on the computer or other programmable apparatus to produce a computer-implemented process such that the instructions which execute on the computer or other programmable apparatus provide operations for implementing the functions specified in the flowchart block(s).

Accordingly, blocks of the flowchart support combinations of means for performing the specified functions, combinations of operations for performing the specified functions and program instruction means for performing the specified functions. It will also be understood that one or more blocks of the flowchart, and combinations of blocks in the flowchart, can be implemented by special purpose hardware-based computer systems which perform the specified functions or operations, or combinations of special purpose hardware and computer instructions.

As shown in FIG. 7, a method for screening manufacturing defects at a memory array according to one example may include programming a background pattern of physically inverse data along conductive lines extending in a first direction at operation 300. The programming may include providing a program conductive line (e.g., a bit line, word line data line or other metal line) with a high value. The method may further include programming a memory cell at an intersection of the program conductive line and a conductive line extending in a second direction to a selected high value at operation 310. The method may further include determining whether a cell initially at a low value and associated with a conductive line extending in the first direction and adjacent to the program conductive line is disturbed at operation 320.

In some embodiments, the operations above may be modified or amplified as described below. Moreover, in some cases, further operations may be conducted in addition to those discussed above, an example of which is shown in FIG. 7 in dashed lines. Some or all of the modifications, amplifications and/or additional operations may be combined in some embodiments in any order and in every possible combination. For example, in some cases, programming the memory cell to the selected high value may include programming the memory cell to a value sufficient to produce hot electron program current as a part of a disturbance sequence. Alternatively or additionally, programming the memory cell to the selected high value may include programming the memory cell to a value between voltage values associated with low voltage value (LVt) and high voltage value (HVt) cells as part of a stress sequence. In some cases, the method may further include screening to determine whether a capacitive or resistive defect exists between the program conductive line and the conductive line extending in the first direction and adjacent to the program conductive line at operation 330. In some cases, screening may include lowering a read judgment level for low voltage value (LVt) cells for detection of a disturbed cell responsive to application of a stress test or disturbance test. Alternatively or additionally, screening may include raising a read judgment level for high voltage value (HVt) cells for detection of a disturbed cell responsive to application of a stress test or disturbance test. Alternatively or additionally, screening may include lowering a reference current and a read judgment level for high voltage value (HVt) cells for detection of a disturbed cell. In some cases, operations 300-320 may be repeated at least two times in separate cycles. In at least one of the separate cycles, programming the memory cell to the selected high value may include programming the memory cell to a value sufficient to produce hot electron program current as part of a disturbance sequence while in the other of the separate cycles, programming the memory cell to the selected high value may include programming the memory cell to a value between voltage values associated with low voltage value (LVt) and high voltage value (HVt) cells as part of a stress sequence. In some cases, operations 300-330 may be repeated in the same manner and with the same modifications described above.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Moreover, although the foregoing descriptions and the associated drawings describe exemplary embodiments in the context of certain exemplary combinations of elements and/or functions, it should be appreciated that different combinations of elements and/or functions may be provided by alternative embodiments without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

What is claimed is:

1. A method of screening manufacturing defects at a memory array comprising:
   programming a background pattern of physically inverse data along conductive lines extending in a first direction, the programming including providing a program conductive line with a high voltage value;
   programming a memory cell at an intersection of the program conductive line and a conductive line extending in a second direction, the programming including providing the memory cell with a selected high voltage value; and
   determining whether a cell initially at a low voltage value and associated with a conductive line extending in the first direction and adjacent to the program conductive line is disturbed.

2. The method of claim 1, wherein programming the memory cell to the selected high voltage value comprises programming the memory cell to a voltage value sufficient to produce hot electron program current.

3. The method of claim 2, wherein programming the memory cell to the voltage value sufficient to produce hot electron program current comprises programming a selectable word line voltage to about 10 V.

4. The method of claim 1, wherein programming the memory cell to the selected high voltage value comprises programming the memory cell to a value between voltage values associated with low voltage value (LVt) and high voltage value (HVt) cells.

5. The method of claim 4, wherein the low voltage value (LVt) is about 4 V and the high voltage value (HVt) is about 8 V.

6. The method of claim 4, wherein programming the memory cell to the selected high voltage value comprises programming the memory cell to about 6 V.

7. The method of claim 1, further comprising screening to determine whether a capacitive or resistive defect exists between the program conductive line and the conductive line extending in the first direction and adjacent to the program conductive line.

8. The method of claim 7, wherein screening comprises lowering a read judgment level for low voltage value (LVt) cells for detection of a disturbed cell responsive to application of a stress test or disturbance test.

9. The method of claim 7, wherein screening comprises raising a read judgment level for high voltage value (HVt) cells for detection of a disturbed cell responsive to application of a stress test or disturbance test.

10. The method of claim 7, wherein screening comprises lowering a reference current and a read judgment level for high voltage value (HVt) cells for detection of a disturbed cell.

11. The method of claim 1, wherein the method is conducted at least two times in separate cycles,
    wherein in at least one of the separate cycles programming the memory cell to the selected high voltage value comprises programming the memory cell to a value sufficient to produce hot electron program current, and
    wherein in the other of the separate cycles programming the memory cell to the selected high voltage value comprises programming the memory cell to a value between voltage values associated with low voltage value (LVt) and high voltage value (HVt) cells.

12. The method of claim 11, further comprising screening to determine whether a capacitive or resistive defect exists between the program conductive line and the conductive line extending in the first direction and adjacent to the program conductive line.

13. The method of claim 12, wherein screening comprises lowering a read judgment level for low voltage value (LVt) cells for detection of a disturbed cell responsive to application of a stress test or disturbance test.

14. The method of claim 12, wherein screening comprises raising a read judgment level for high voltage value (HVt) cells for detection of a disturbed cell responsive to application of a stress test or disturbance test.

15. The method of claim 12, wherein screening comprises lowering a reference current and a read judgment level for high voltage value (HVt) cells for detection of a disturbed cell.

* * * * *

UNITED STATES PATENT AND TRADEMARK OFFICE
CERTIFICATE OF CORRECTION

PATENT NO. : 8,351,286 B2
APPLICATION NO. : 12/842605
DATED : January 8, 2013
INVENTOR(S) : Huang et al.

Page 1 of 1

It is certified that error appears in the above-identified patent and that said Letters Patent is hereby corrected as shown below:

In the Specifications:

Column 3,
Line 54, "I-IVt" should read --HVt--.

Signed and Sealed this
Ninth Day of July, 2013

Teresa Stanek Rea
*Acting Director of the United States Patent and Trademark Office*